United States Patent
Sullivan (10) Patent No.: US 7,368,731 B2
(45) Date of Patent: May 6, 2008

(54) METHOD AND APPARATUS WHICH ENABLE HIGH RESOLUTION PARTICLE BEAM PROFILE MEASUREMENT

(75) Inventor: Jeffrey S. Sullivan, Castro Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 11/241,197

(22) Filed: Sep. 30, 2005

(65) Prior Publication Data

US 2007/0085524 A1   Apr. 19, 2007

(51) Int. Cl.
*G21G 5/00* (2006.01)

(52) U.S. Cl. ................ 250/492.1; 250/397; 250/492.2; 324/71.3

(58) Field of Classification Search ........... 250/397, 250/491.1, 492.2; 324/71.3
See application file for complete search history.

(56) References Cited

U.S. PATENT DOCUMENTS

| | | | |
|---|---|---|---|
| 5,622,796 A | 4/1997 | Canestrari et al. ............ 430/22 |
| 5,798,947 A | 8/1998 | Ye et al. ..................... 361/589 |
| 5,825,670 A | 10/1998 | Chernoff et al. ....... 364/571.02 |
| 6,111,646 A * | 8/2000 | Naulleau et al. ............ 356/494 |
| 6,137,578 A | 10/2000 | Ausschnitt ................... 356/399 |
| 2002/0171922 A1* | 11/2002 | Shiraishi .................... 359/359 |
| 2005/0122593 A1* | 6/2005 | Johnson ..................... 359/650 |
| 2007/0057204 A1* | 3/2007 | Kruit et al. ............ 250/492.23 |

FOREIGN PATENT DOCUMENTS

WO    WO 2004/090979 A2    2/2001

OTHER PUBLICATIONS

Diebold, Alain C., et al. "A Critical Analysis of Techniques and Future CD Metrology Needs", Solid State Technology, pp. 63-64, 66, 68, and 70, Jul. 2003.
Shirasaki, H., "Arbitrary 3D Linewidth Form Measurement Simulations for the Next-Generation Semiconductor Circuits by Scatterometry Using the FDTD Method", Metrology, Inspection, and Process Control for Microlithography XVIII, edited by Richard M. Silver, *Proc. of SPIE*, vol. 5375, pp. 1339-1345, SPIE, Bellingham, WA, 2004.
Sills, Robert M. et al., "E-Beam System Metrology", *Solid State Technology*, pp. 191-196, Sep. 1983.

(Continued)

*Primary Examiner*—Jack I. Berman
*Assistant Examiner*—Michael J Logie
(74) *Attorney, Agent, or Firm*—Shirley L. Church (57) ABSTRACT

The PSF for a metrology array for high resolution particle beam profile measurement has been improved by improving five major elements of the metrology array. While improvement in each of the five elements provides and improved PSF, a combination of all five of the elements provides an unexpected synergistic effect. The individual elements include the use of a plurality of slots as apertures; use of a high-Z material in forming the array; employing sidewalls on the slotted opening apertures where the sidewall forms an angle with a horizontal surface at the base of the array which is at least 75°; employing a knife edge where the upper corner radius ranges from about 1 nm to about 5 nm; and providing a surface finish at the upper corner of each knife edge which is less than 5 nm RMS.

13 Claims, 6 Drawing Sheets

OTHER PUBLICATIONS

Wittmann, R.C. et al., "Nonideal Measurement Locations in Planar Near-Field Antenna Metrology", National Institute of Standards and Technology, 325 Broadway, Boulder, CO 80303-3328, U.S. Government Work Not Protected by U.S Copyright.

Xie, Xiaolin et al., "Characterizing STI CMP Processes With and STI Test Mask Having Realistic Geometric Shapes", Mat. Res. Soc. Symp. Proc., vol. 816, pp. 275-282. Materials Research Society, 2004.

* cited by examiner

METHOD AND APPARATUS WHICH ENABLE HIGH RESOLUTION PARTICLE BEAM PROFILE MEASUREMENT

FIELD OF THE INVENTION

In general, the present invention relates to a method and apparatus which enable high resolution particle beam profile measurement.

BRIEF DESCRIPTION OF THE BACKGROUND ART

There is no admission that the background art disclosed in this section constitutes prior art.

To be able to use a particle beam, such as an electron beam, by way of example and not by way of limitation, to create a pattern on a substrate, it is important to know the profile of the beam. The profile of the beam refers to the intensity of the beam as a function of position/location on the beam. Knowledge of the profile of the beam is innately valuable, because it shows how the particles, electrons for example, are being put down on the substrate, which determines how the pattern is formed. Since formation of the pattern on the substrate is carried out by making one little shape, and then another right next to it, and another little shape next to that, understanding at the very edges of the shapes how those shapes combine is important.

For example, when a the pattern being formed is an image in a photoresist, whether for direct production of a semiconductor device, or in the fabrication of a photomask/resist, the pattern is being created "blind", where the actual pattern being created is not visible. Knowledge of the profile of the beam enables the technologist to be able to predict the pattern image which is being created in the photoresist. In fact, knowledge of the profile of the beam enables the technologist to "tune" the beam profile in order to obtain a desired pattern image in the photoresist. The general shape of the beam may be a rectangle, a triangle, or a square, for example, and the beam profile will be different for each general shape.

Typically, a particle beam profile such as an e-beam profile has been determined by scanning the beam relative to edges in two orthogonal directions and measuring the beam current that is not obscured by the grid with a detector. Most simply, the edge is held stationary, and the particle beam is scanned (position is changed via deflection as a function of time) over the edge while the number of particles (e.g. current) that pass the grid striking a detector is monitored as a function of time. Because both the position of the particle beam and the current are known as related to time, the current is also known as a function of position. The current striking the detector is the integral of the particle-beam current density that is not obscured by the edge. To re-obtain the particle-beam current density profile, software may be used to take the derivative of the current versus position function.

One of skill in the field of particle beams will recognize that there are several shortcomings in the simple method of measuring a beam current-density profile; particularly if the beam is blanked (rapidly turned on and off) or scanned during normal use, as these actions may distort the dose deposited on the target as compared to the beam profile. In this sense, the dose is the time integral of the particle-beam current-density profile as it strikes the target. For example, instead of continuously scanning the beam over the edge, the beam may be stepped over the edge. In stepping, the beam is moved in small increments and then held steady while the current is measured in each position for a longer time. The longer time period at each beam position relative to the edge allows for a more accurate measurement of the current at each position. Typically 100 to 1000 unique positions would be measured, and particle beams may range in extent from 25 nanometers to 2000 nanometers. The exact relationship between the number of unique positions and the size of the particle beam will depend on the spatial resolution required by the application and the time allowed to take the measurement. For maximum resolution, the distance between unique steps must be less than ½ the width of the point spread function (PSF) of the metrology array edges, which, for the invention described herein would be less than about 1.5 nanometers(nm).

Additional complexity may be added to the measurement to obtain more accurate information. For example, the particle beam may be blanked on and off repeatedly at each unique measurement position to account for blanking affects. If the particle beam is scanned during normal operation, the blanking may be combined with scanning the beam where the beam is unblanked at the position of the scan corresponding to the unique measurement position.

A metrology array is used to measure beam profile. The metrology array most commonly used has been a square lattice. The openings in the array are typically such that the ratio of opening to bar is about 1:1. A limiting factor of this design is the heat conduction from along the bar, due to interaction of the beam with the bar. The limited availability of heat conduction changes the temperature at the measurement point, and thermal expansion at the measurement point causes the grid to drift. When the grid drifts with respect to the particle beam, the measurement changes, making the measurements inaccurate.

A critical figure of merit for a metrology array is the width of the point-spread function (PSF). The PSF is the effect of convolution between the metrology array and the particle beam. To convincingly measure the profile of an electron beam, without relying on deconvolving the metrology array, for example, the PSF of the array should be at least 3 times smaller than the intrinsic blur of the electron beam. The blur of the electron beam as used herein means the width of the profile edges. For example, one metric of the blur is the Y direction or X direction distance between 20% and 80% of the maximum current density on a plot of the kind shown in FIGS. 4-6 of the present disclosure. To measure the profile of an electron with intrinsic blur of 10 nm, the PSF of the metrology array should be in the range of 3 nm. The current state of the art for a metrology array is approximately 30 nm, although isolated edges with the required PSF exist.

In an effort to reduce the PSF of the metrology array, efforts have been made to increase the effective opaqueness of the material on the surface of the array. The scattering of electrons passing through the array material is analogous to the opaqueness of the material. Since the scattering probability of a material is proportional to $Z^2$, high-Z materials are often deposited on silicon metrology arrays after fabrication of the array. This not only requires additional processing of the array, but also roughens the edges of apertures in the array, further increasing the PSF of the aperture.

Another important factor in determination of the PSF of the metrology array is the kind of edge present at the edges of the apertures in the array. Silicon metrology arrays typically are created using an etch process that creates sidewalls which are at about a 55 degree angle with respect to a horizontal surface beneath the sidewalls. This angle causes an increase in the PSF due to the limited material thickness near the edge of the aperture, making opaqueness a function of distance from the edge. To emulate a step function in opaqueness of the aperture, those skilled in the art have created high-angle edges (knife edges) by cleaving a crystal of indium phosphide, for example. This method of creating edges creates only a single edge and is not reliable in terms of a manufacturable, reliable means of edge creation.

There is currently a need in the industry to reduce the PSF of a metrology array, so that better resolution of a particle beam profile measurement can be achieved.

SUMMARY OF THE INVENTION

The PSF for a metrology array for high resolution particle beam profile measurement has been improved by improving five major elements of the metrology array which impact the PSF of the array. While improvement in each of the five elements provides and improved PSF, a combination of all five of the elements provides an unexpected synergistic effect. The individual element improvements are as follows. 1) The metrology array comprises a plurality of slots rather than the previously-used square openings of the kind described above. The use of slotted openings in the metrology array reduces thermal effects because the thermal resistance away from the measurement point is lower. The lower thermal resistance is achieved because a lower percentage of the array substrate is removed than in a 1:1 square grid design, for example. 2) At least the upper 0.25 µm of thickness of the metrology array is comprised of a high-Z (high atomic number) material. Typically the upper 1 µm of thickness is essentially the high-Z material. In some instances, the entire substrate may be a high-Z material. A high-Z material is one in which the atomic number of the material is at least 45. The use of a high-Z material improves the opaqueness of the material to the particle beam, improves the scattering probability at the solid surfaces of the metrology array substrate, and provides better resolution in the backscattered image used to produce the beam shape profile. 3) The sidewalls on the slotted opening area of the metrology array substrate form an angle with a horizontal surface at the base of the metrology array substrate which is at least 75°, and which typically ranges from about 83° to about 89°. The steeper sidewall angles of the slotted opening in the metrology array substrate provide better contrast along the edge of the slot, because the edge transitions from 100% transmitting to 100% opaque is less distance. 4) The radius at the upper corner (knife edge) of a slotted opening ranges from about 1 nm to about 5 nm. The high Z material is applied to the substrate at an appropriate time in the manufacturing process, with respect to before or after slot formation, to minimize the radius. 5) The edge roughness at the upper corner (the knife edge) of each slot is less than 5 nm RMS, and typically ranges from about 1 nm RMS to about 3 nm RMS. The reduction in edge roughness from that typically present prior to the present invention also improves the contrast along the edge of the slot, so that there is less blur of the edge in the backscattered image used to produce the beam shape profile.

As previously discussed, a critical element for a metrology array is the width of the point-spread function (PSF). To accurately measure the profile of a particle beam, such as an electron beam, for example and not by way of limitation, the PSF should be at least three times smaller than the intrinsic blur of the electron beam. A typical particle beam blur for current day device feature sizes is in the range of 10 nm. The current apparatus (metrology arrays meeting the elemental requirements of the present invention) is capable of providing a PSF of about 3 nm or less.

DETAILED DESCRIPTION OF THE INVENTION

As a preface to the detailed description, it should be noted that, as used in this specification and the appended claims, the singular forms "a", "an", and "the" include plural referents, unless the context clearly dictates otherwise.

Use of the term "about" herein indicates that the named variable may vary to ±10%.

A substantial improvement in the measurement of a particle beam profile has been achieved using an improved metrology array over which the particle beam is scanned to obtain the beam profile. The point-spread function (PSF) of the a metrology array has been improved to provide better resolution of the particle beam profile. Although the embodiments described herein are with respect to an electron beam profile, one skilled in the art will see that the principles applied in the improvement of the metrology array are applicable to the improvement in measurement of beam profile with respect to any particle beam.

The metrology array has been improved by improving five major elements of the metrology array which impact the PSF of the array. While improvement in each of the five elements provides and improved PSF, a combination of all five of the elements provides an unexpected synergistic effect. By creating a metrology array which includes improvement of all five elements in the manner described, the PSF of the metrology array has been reduced to less than 3 nm.

Figure 1:
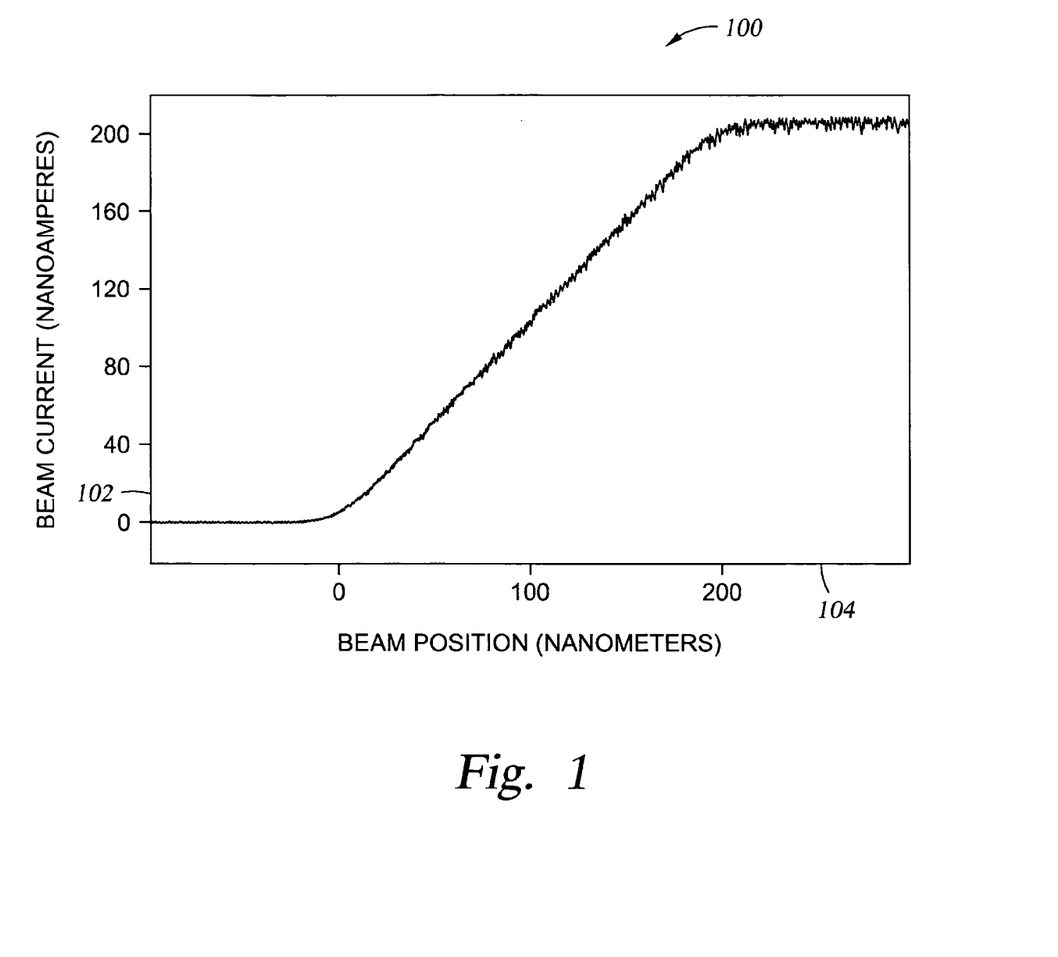
FIG. 1 is an illustration of electron beam current, including simulated noise as a function of the electron beam position with respect to the grid edge.

FIG. 1 shows a simulated plot 100 of the measured current on axis 102 as a function of beam position with respect to the grid, including noise, on axis 104. The simulated plot is for a square beam which is 200 nm in extent with 20 nm wide tails, where the beam is scanned over a theoretical metrology array with step-function contrast to produce a plot. Upon reviewing the plot 100, it becomes readily apparent that measuring the width of the tails of the beam at the low current region will provide a more accurate measurement at the edge of the beam. The low current portion of the plot where the magnitude of the noise is less should be considered, because the noise level will not increase the apparent PSF of the metrology array beyond the desired PSF, which is in the range of 3 nm or less.

Figure 2A:
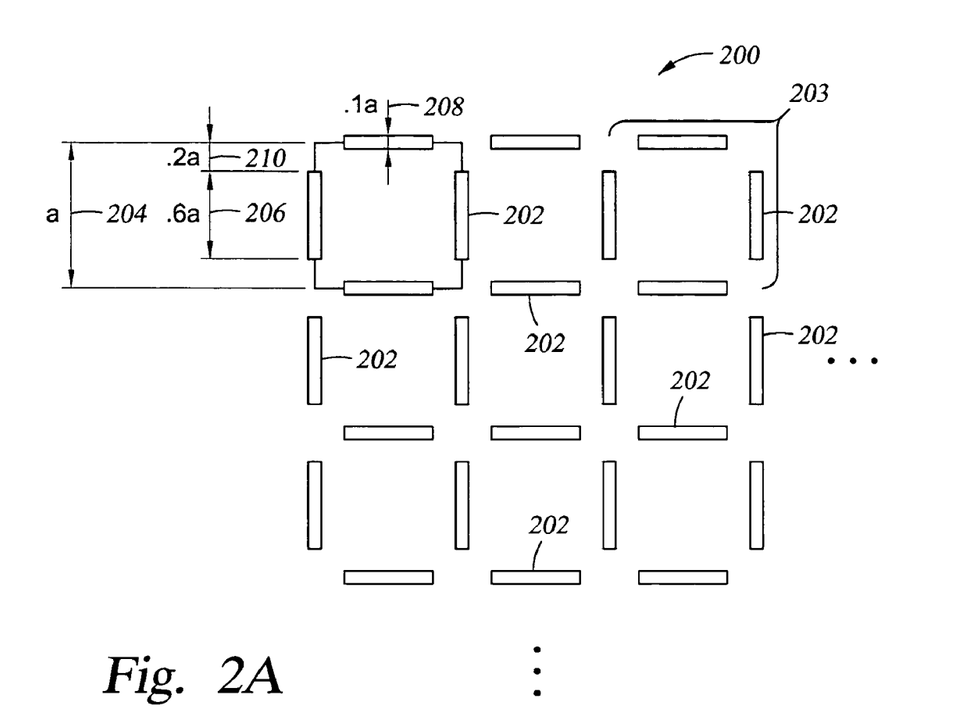
FIG. 2A shows a top view schematic of one embodiment of a slotted metrology array of the kind which may be used in the present invention.

FIG. 2A shows a top view schematic 200 of one embodiment of a slotted metrology array of the kind which may be used in the present invention. The slots 202 are placed in a grid, where four slots make up a square 203 and, and where a portion of the slots 202 are shared between sidewalls for two squares. The length of the sidewall 204 of a square is designated as "a", which can be a nominal distance determined by the measurement application. When the particle beam profile which is being measured is an electron beam, the nominal value "A" ranges between about 25 µm and about 2.5 µm. The length 206 of the slot 202 in this particular embodiment is 0.6 times a. The width 208 of the slot 202 is 0.1 times a. The end distance 210 of solid array substrate at each end of the slot 202 is 0.2 times a, so that the slot 202 plus two times the end distance 210 equals a total sidewall 204 length, a, of each square. The aspect ratio of a slot, the height of a sidewall (not shown) divided the width 208 of a sidewall may be varied depending on the application. The length and width of a slot relative to the sidewall length for a square is a trade off between heat conductivity and the ability to use the slot to find a location on a substrate. Typically the ratio of the length of the slot to the width of the slot ranges from about 3:1 to about 6:1. The pattern shown on FIG. 2A continues arbitrarily off toward the edges of that which is shown.

Figure 2B:
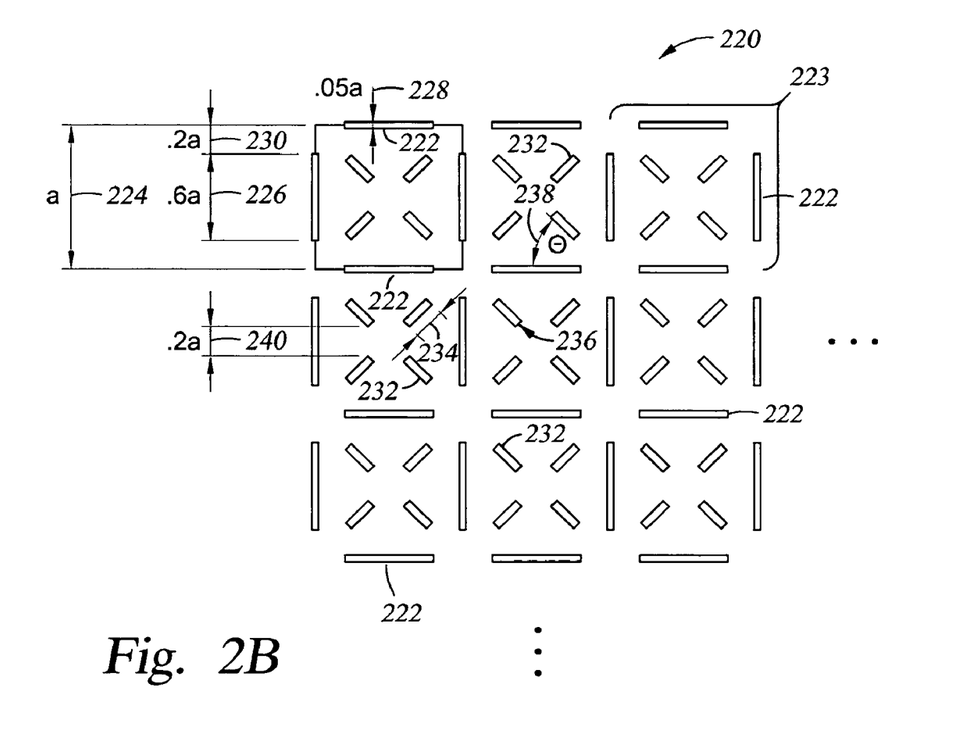
FIG. 2B shows a top view schematic of a second embodiment of a slotted metrology array of the kind which may be used in the present invention.

FIG. 2B shows a top view schematic 220 for a second embodiment of a slotted metrology array of the kind which may be used in the present invention. The slots 222 are placed in a grid, where four slots make up a square 223 and, and where a portion of the slots 222 are shared between sidewalls for two squares 223. The length of the sidewall 224 of a square is designated as "a", which can be a nominal distance determined by the measurement application. When the particle beam profile which is being measured is an electron beam, the nominal value of "a" ranges between about 25 µm and about 2.5 µm. The length 226 of the slot 222 in this particular embodiment is 0.6 times a. The width 228 of the slot 222 is 0.05 times a. The end distance 230 of solid array substrate at each end of the slot 222 is 0.2 times a, so that the slot 222 plus two times the end distance 230 equals a total sidewall 224 length, a, of each square 223. The slots 232 which are interior to square sidewalls 224 have a length 234 of about 0.25 times a. The interior slots 232 have a width 236 of 0.1 times a. A centerline through interior slots 232 forms an angle θ of 45° with sidewall 222. The center distance 240 between interior slots 232 is 0.2 times a. The metrology array shown in FIG. 2B may be used to look at beams that are not rectangular in shape, for example, beams which are triangular in shape.

Although the two embodiment metrology arrays shown in FIGS. 2A and 2B are four-fold designs, one skilled in the art can envision additional shapes and patterns which can be used in the array and still take advantage of the elements of the invention described herein. It is not intended that the invention bel limited to these grid designs. In any case, a design similar to the four-fold pattern shown in FIG. 2A offers the advantage that 88% of the high-Z substrate used as the substrate for the array surface remains after patterning. This increases the thermal mass of the structure, limiting the temperature rise which occurs on the array surface during profiling of the beam. Additionally, the gaps between bars are designed to optimize thermal conductivity away from the slots used as the metrology site. Since a lower temperature means less thermal drift takes place on the substrate surface during beam profiling, the beam position with respect to the edge is better known, and the measurement is more accurate.

Figure 3A:
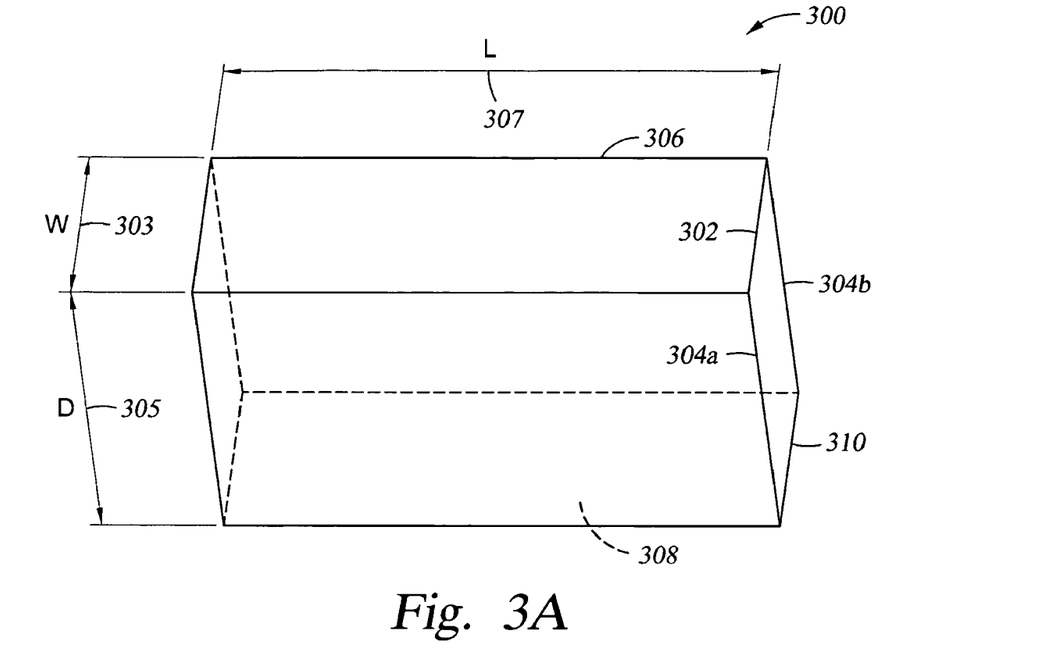
FIG. 3A shows a side view schematic of a slot of the kind used in FIGS. 2A and 2B, and illustrates the aspect ratio of the exemplary slot.
Figure 3B:
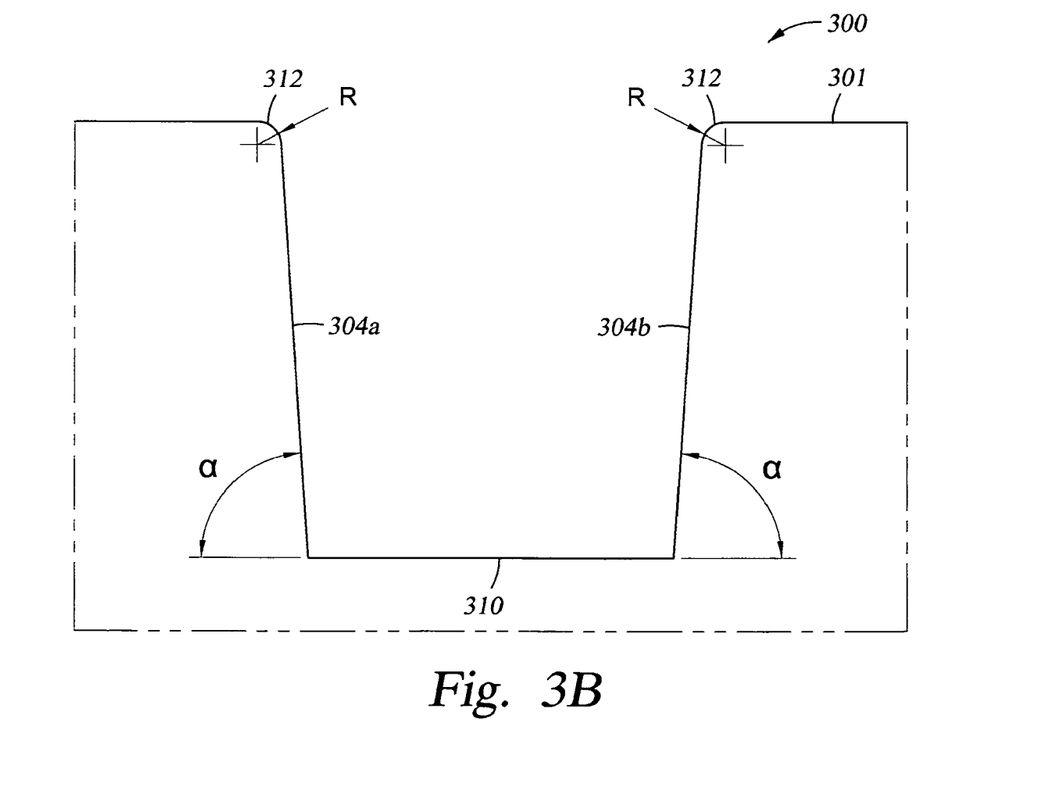
FIG. 3B shows a side view schematic of the end of the slot shown in FIG. 3A, for purposes of illustrating the sidewall angle of the sidewalls of the slot relative to a horizontal surface at the base of the slot.

FIG. 3A shows a side view schematic of a slot 300 of the kind used in FIG. 2A. The slot 300 has a width 302 having a nominal value 303, a length 306 having a nominal value 307, and a depth 304, having a nominal value 305. The bottom 308 of slot 300 is open. The bottom 308 of slot 300 is a horizontal surface. Sidewalls 304a and 304b are at an angle α with respect to bottom 308 of slot 300, as shown in FIG. 3B. The aspect ratio of the slot 300 is the depth of the slot D divided by the width of the slow W. Typically, the aspect ratio for a slot 300 used to form a grid in a matrix array of the kind described with respect to the present invention ranges from about 1:10 to about 10:1. More typically, the aspect ratio ranges from about 4:1 to about 10:1. The angle α typically ranges from about 80° to about 89°. More typically, the angle α ranges from about 85° to about 88°.

FIG. 3B also shows the corner 312 at the upper surface 301 of the slot 300. The corner 312 at upper surface 301 forms a radius R between sidewall 304a and surface 301, and between sidewall 304b and surface 301. This radius R typically ranges from about 1 nm to about 5 nm. Further, corner 312 has a surface finish which is designed to provide contrast at the edge provided by corner 312. Typically the surface finish ranges from about 1 nm RMS to about 3 nm RMS, and frequently is in the range of about 2.5 nm.

With respect to the high Z materials which need to comprise the metrology array substrate, at least in the upper portion of the slotted apertures, materials such as tungsten or tantalum work well. Other materials such as indium phosphide, gold, platinum, which have an atomic number of at least 45 may also be used. When it is desired to have only an upper portion of the matrix array formed from the high Z material, due to difficulty in forming the slots in the high Z material, it is possible to use a thin layer of the high Z material which is bonded to a surface of the matrix array. For example, and not by way of limitation, a thin foil of tungsten having slots formed therein using a technique such as FIB cutting may be applied over another substrate surface which is used for support. The tungsten foil thickness must be sufficient to absorb or back scatter nearly all of the electrons that strike the foil. In practice, about 1 µm of tungsten thickness is more than adequate. However, tungsten foil is generally available commercially in thicknesses down to 10 µm. While 10 µm surpasses the requirement and may be used, this additional thickness in the foil makes formation of the slots in the foil more difficult. With this in mind, thinner foils should be used if they are available. Alternatively, thin films of tungsten or platinum or other high Z material may be deposited on a carrier material such as silicon, by way of example and not by way of limitation.

Figure 4:
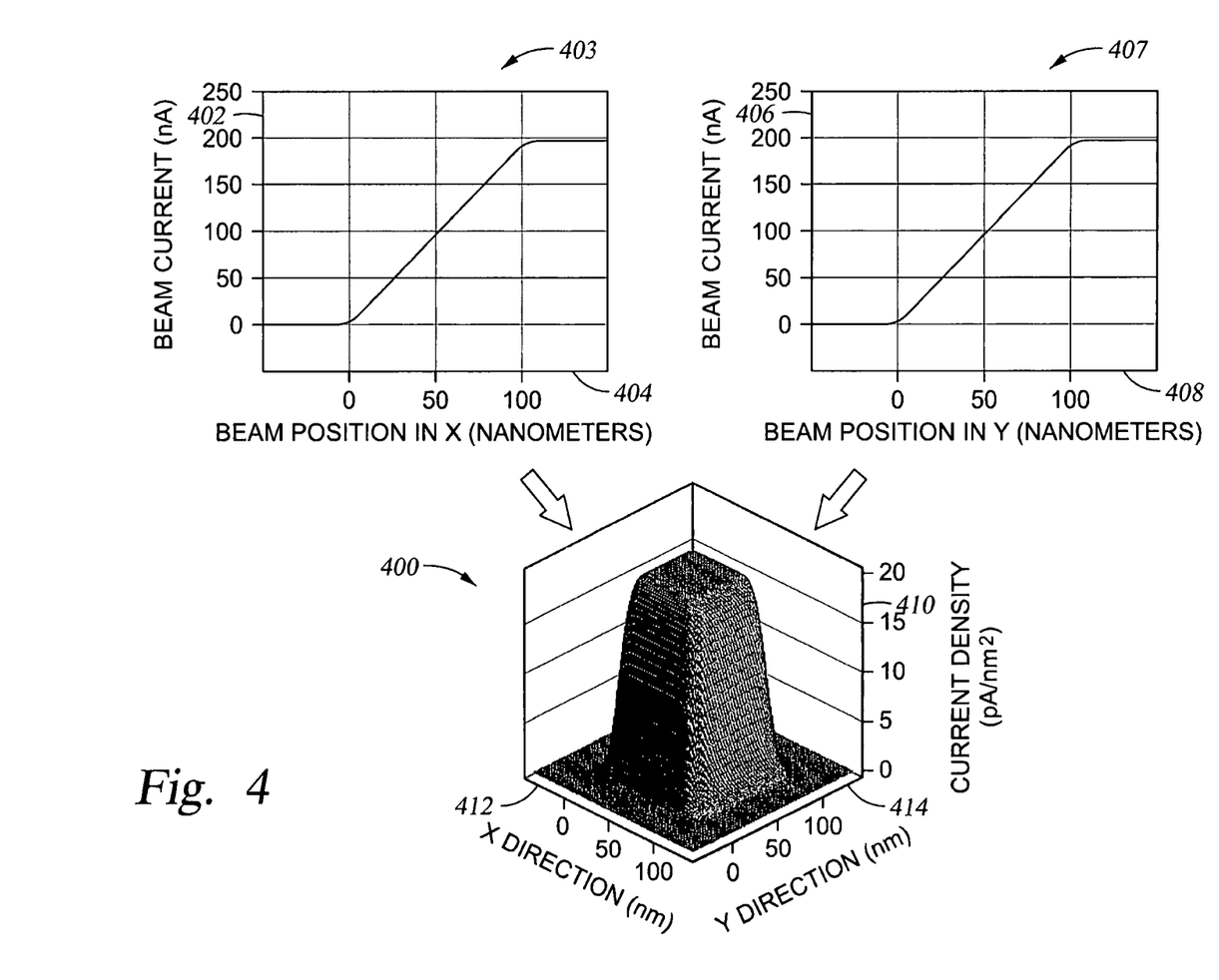
FIG. 4 shows an exemplary beam profile for a square shaped beam, scanned over a perfect metrology edge (having no blur caused by the metrology edge).

FIG. 4 shows an exemplary simulated beam profile for a square shaped beam, scanned over a perfect metrology edge (having no blur caused by the metrology edge). The simulated beam profile was created using software known in the art, with the assumptions of a 100 nm square beam exhibiting a 10 nm blur on the beam tales, measured with an array exhibiting a 0 nm PSF. Plot 403 shows the beam current density in nA on axis 402, as a function of the beam position in X nm on axis 404. Plot 407 shows the beam current density in nA on axis 406, as a function of the beam position in Y nm on axis 408. Simulated beam profile 400 shows the beam current density in pA/nm$^2$ on axis 410 as a function of the beam position in X nm on axis 412 and the beam position in Y nm on axis 414.

Figure 5:
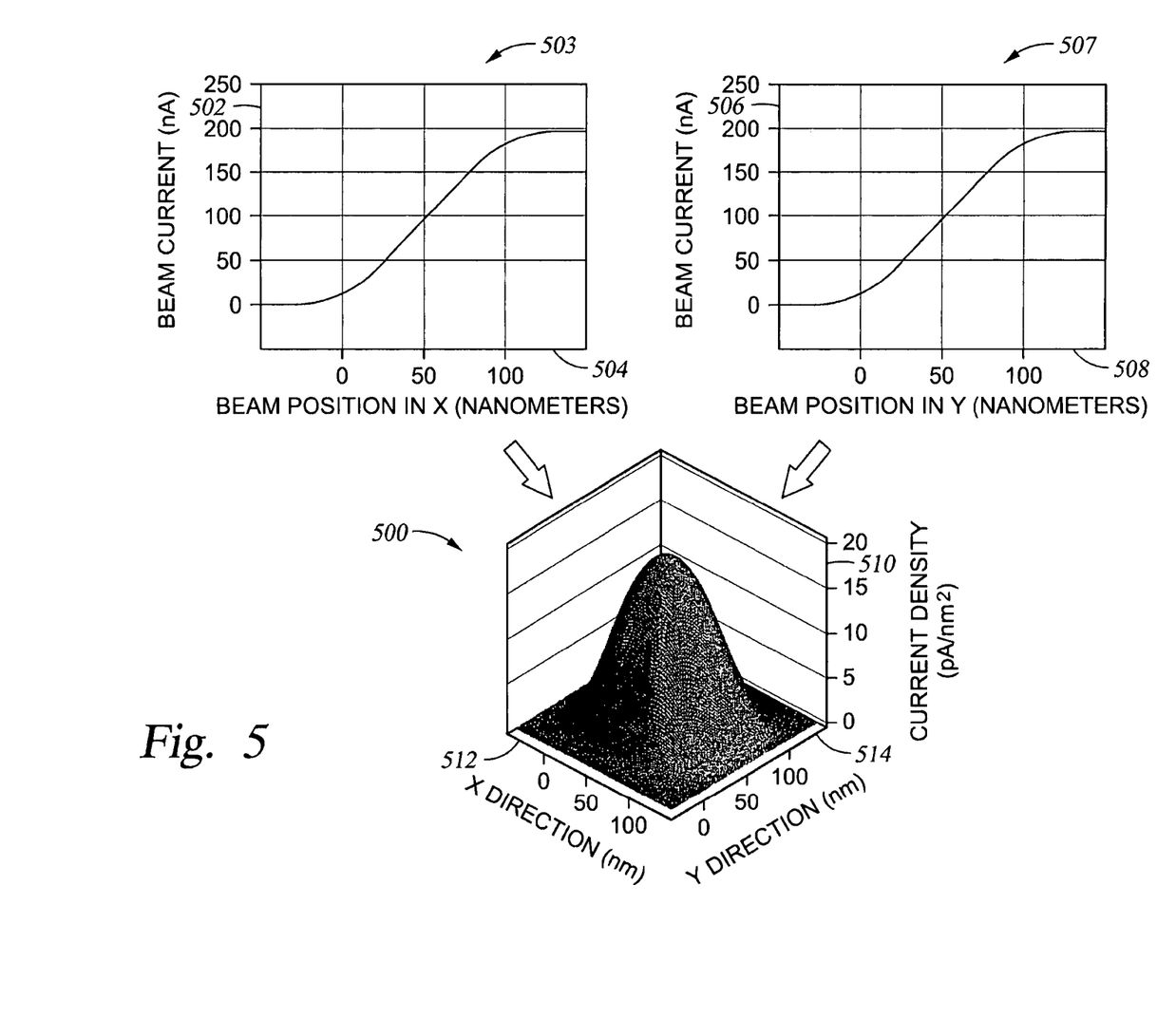
FIG. 5 is for comparative purposes, and shows an exemplary beam profile for a square shaped beam scanned over a square-shaped opening metrology array of the kind typically used in the industry prior to the present invention.

FIG. 5 is for comparative purposes, and shows an exemplary simulated beam profile for a square shaped beam scanned over a square-shaped opening metrology array of the kind typically used in the industry prior to the present invention. The assumptions were a 100 nm square beam, exhibiting a 10 nm blur on the beam tales, measured with an with an array exhibiting a 30 nm PSF. Plot 503 shows the beam current density in nA on axis 502, as a function of the beam position in X nm on axis 504. Plot 507 shows the beam current density in nA on axis 506, as a function of the beam position in Y nm on axis 508. Simulated beam profile 500 shows the beam current density in pA/nm$^2$ on axis 510 as a function of the beam position in X nm on axis 512 and the beam position in Y nm on axis 514.

Figure 6:
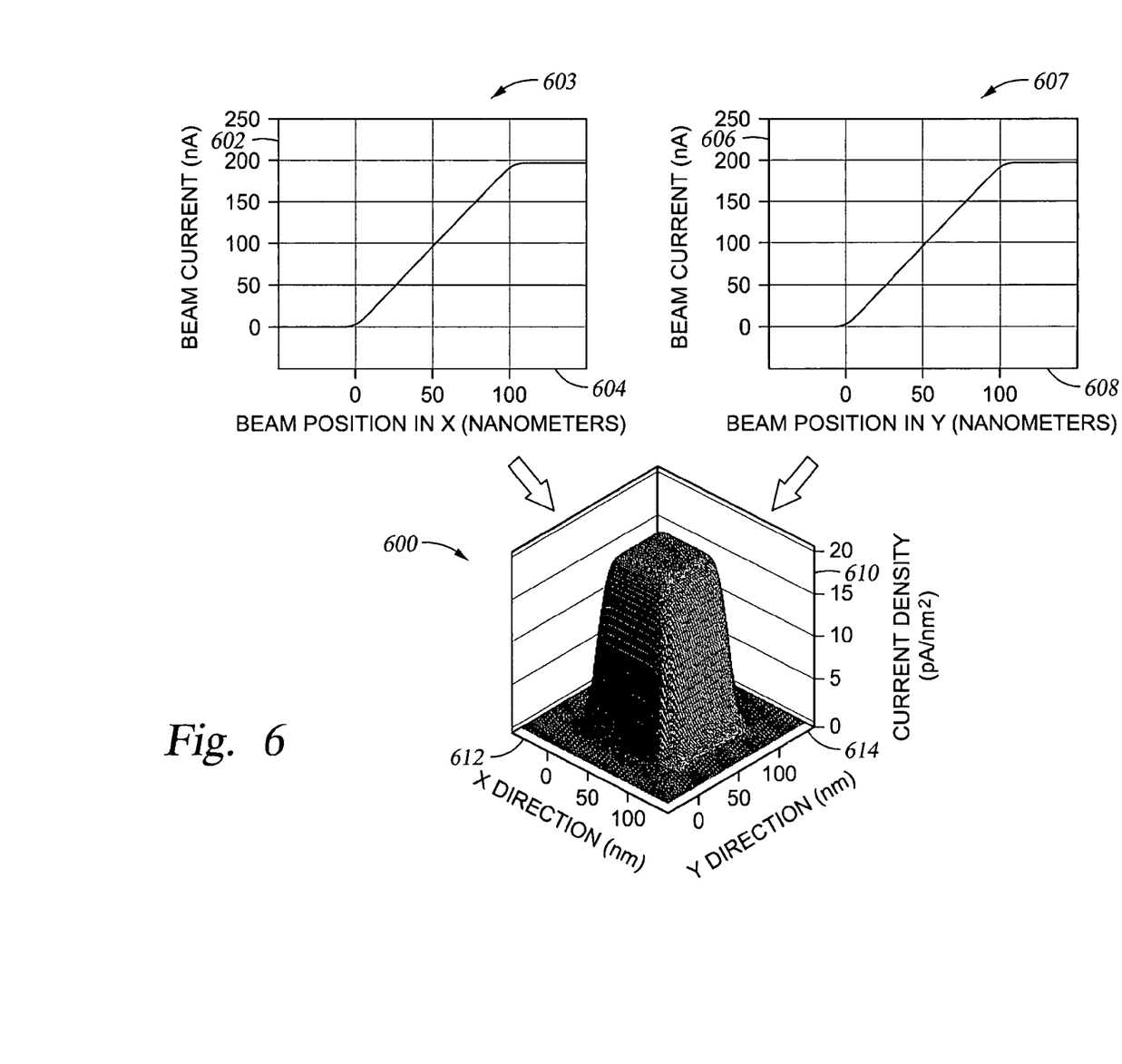
FIG. 6 shows an exemplary beam profile for a square shaped beam, scanned over a metrology edge which meets the requirements of the present invention.

FIG. 6 shows an exemplary beam profile for a square shaped beam, scanned over a metrology edge which meets the requirements of the present invention. The assumptions were a 100 nm square beam, exhibiting a 10 nm blur on the beam tales, measured with an with an array exhibiting a 3 nm PSF. Plot 603 shows the beam current density in nA on axis 602, as a function of the beam position in X nm on axis 604. Plot 607 shows the beam current density in nA on axis 606, as a function of the beam position in Y nm on axis 608. Simulated beam profile 600 shows the beam current density in pA/nm$^2$ on axis 610 as a function of the beam position in X m on axis 612 and the beam position in Y nm on axis 614. Clearly the array of the present invention enables one skilled in the art to have a more accurate understanding of the shape of the beam, which enables the creation of a pattern of smaller feature size, the alignment of patterns during manufacturing with greater accuracy, and the determination of whether a semiconductor device meets specification when the feature sizes are in the ranges discussed herein, for example. One skilled in the art will recognize the myriad of applications for the present invention.

While the invention has been described in detail above with reference to particular schematics and drawings, various modifications within the scope and spirit of the invention will be apparent to those of working skill in this technological field. One skilled in the art, upon reading applicants' disclosure, can make use of metrology arrays which utilize slotted openings as apertures in the array; aperture sidewalls where the sidewalls form an angle with a horizontal base which is at least 75°, and typically range between about 80° and 89°; knife edges at the upper corners of the array surface, where the corner radius included within the knife edge ranges between about 1 nm and about 5 nm; a finish on the knife edge upper surface of the apertures which ranges between about 1 nm RMS and about 3 nm RMS; and a high-Z material as the substrate material in which the array apertures are formed. Various combinations of these advantageous array features may be used to reduce the blur produced as a result of the metrology array design. By optimizing each of these advantageous array features for a given particle beam, the blur produced can be substantially reduced, permitting one skilled in the art to take advantage of the invention disclosed. Accordingly, the scope of the invention should be measured by the appended claims.

I claim:

1. A method of reducing the point spread function for high resolution particle beam profile measurement, comprising:
   providing a substrate including a high atomic number material;
   creating a plurality of slotted openings through said high atomic number material;
   creating said plurality of slotted openings using a technique which provides a knife edge around a periphery of said slotted openings, where the radius of said knife edge ranges from about 1 nm to about 5 nm; and
   finishing the surface of said knife edge so that the surface roughness of said surface is less than about 5 nm RMS.

2. A method in accordance with claim 1, wherein said particle beam is an electron beam, wherein a width of at least one of said slotted openings ranges from about 0.25 µm to about 2.5 µm, and a length of at least one of said slotted openings ranges from about 0.75 µm to about 20 µm.

3. A method in accordance with claim 1 or claim 2, wherein an angle is formed between a sidewall of said slotted opening and a horizontal substrate beneath said sidewalls which is at least 75°.

4. A method in accordance with claim 3, wherein said sidewall angle is formed to range between about 80° and about 89°.

5. A method in accordance with claim 4, wherein said sidewall angle is formed to range between about 84° and about 89°.

6. A method in accordance with claim 1, wherein said knife edge surface is finished to an RMS finish between about 1 nm and about 3 nm.

7. A method in accordance with claim 1, wherein said particle beam is selected from the group consisting of an electron beam, an ion beam, a laser beam, a proton beam, a neutron beam, or an X-ray.

8. A metrology array used to measure a beam profile of a particle beam, said metrology array comprising:
   a substrate including a high atomic number material;
   a plurality of slotted openings through said high atomic number material;
   a knife edge around a periphery of said slotted openings, where the radius of said knife edge ranges from about 1 nm to about 5 nm; and
   a surface finish on said knife edge which is less than about 5 nm RMS.

9. A metrology array in accordance with claim 8, wherein a width of at least one of said slotted openings ranges from about 0.25 µm to about 2.5 µm, and a length of at least one of said slotted openings ranges from about 0.75 µm to about 20 µm.

10. A metrology array in accordance with claim 8 or claim 9, wherein an angle between a sidewall of said slotted opening and a horizontal substrate beneath said sidewall is less than about 75°.

11. A metrology array in accordance with claim 10, wherein said sidewall angle ranges between about 80° and about 89°.

12. A metrology array in accordance with claim 11, wherein said sidewall angle ranges between about 84° and about 89°.

13. A metrology array in accordance with claim 8, wherein said knife edge surface exhibits an RMS finish between about 1 nm and about 3 nm.

* * * * *